(12) United States Patent
Lai

(10) Patent No.: US 6,272,722 B1
(45) Date of Patent: Aug. 14, 2001

(54) DEVICE FOR RETAINING COMPUTER CPU COOLING PIECE

(76) Inventor: Yaw-Huey Lai, No. 20-3 Lane 65, Lien Cheng Rd. Chung Hu City, Taipei Hsien (TW)

( * ) Notice: Subject to any disclaimer, the term of this patent is extended or adjusted under 35 U.S.C. 154(b) by 0 days.

(21) Appl. No.: 09/441,993

(22) Filed: Nov. 18, 1999

(30) Foreign Application Priority Data

Oct. 8, 1999 (TW) ................................................ 88217092

(51) Int. Cl.[7] .............................. A44B 21/00; B42F 1/00; H05K 7/20
(52) U.S. Cl. ................................ 24/458; 24/459; 24/487; 361/704
(58) Field of Search ............................. 24/458, 459, 487; 361/704

(56) References Cited

U.S. PATENT DOCUMENTS

| | | | |
|---|---|---|---|
| 4,679,754 | * 7/1987 | Richards | 24/458 |
| 5,600,540 | * 2/1997 | Blomquist | 361/704 |
| 5,638,258 | * 6/1997 | Lin | 361/704 |
| 5,860,195 | * 1/1999 | Wang | 24/459 |
| 5,979,025 | * 11/1999 | Horng | 24/458 |

* cited by examiner

Primary Examiner—Victor N. Sakran
(74) Attorney, Agent, or Firm—Browdy & Neimark

(57) ABSTRACT

A device is designed to retain a cooling piece of a computer CPU. The device comprises a main body which is provided in two segments thereof with two legs opposite to each other. The legs are provided with a hook extending outwards and upwards, and a retainer of a curved construction. The main body is provided with two winged portions which are located at both ends thereof and provided with a through hole.

4 Claims, 3 Drawing Sheets

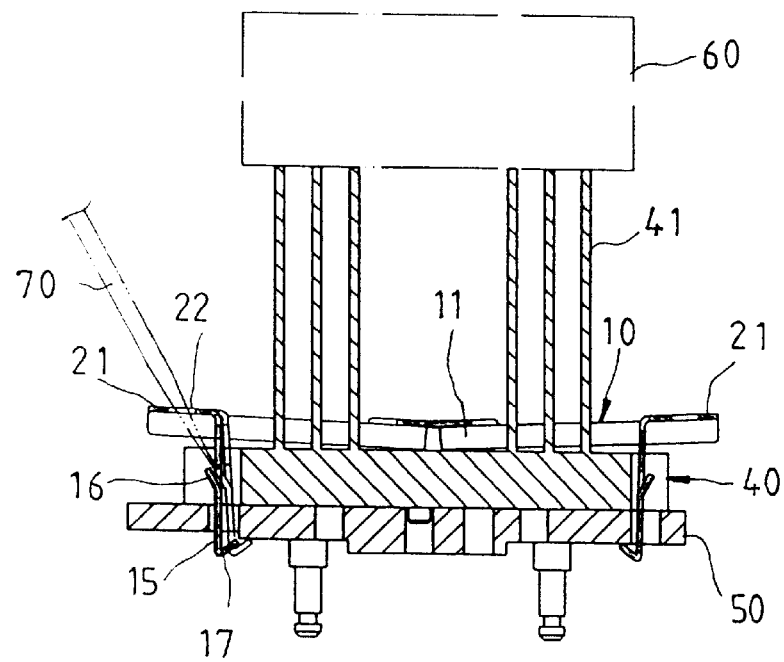
F I G. 5
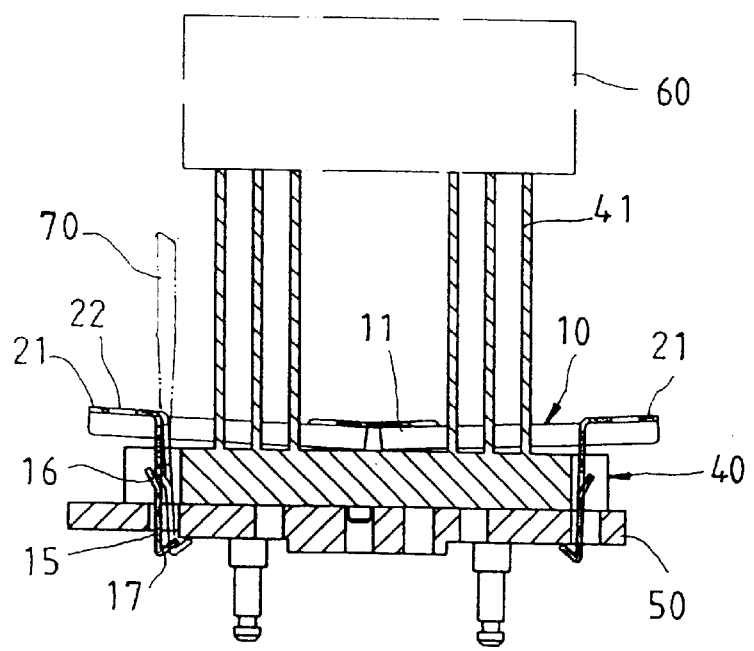
F I G. 6

DEVICE FOR RETAINING COMPUTER CPU COOLING PIECE

FIELD OF THE INVENTION

The present invention relates generally to a cooling piece of the central processing unit of a computer, and more particularly to a retaining device of the central processing unit (CPU) cooling piece.

BACKGROUND OF THE INVENTION

As shown in FIG. 1, a prior art retaining device 80 of the CPU cooling device comprises a long plate 81 which is provided at both ends thereof with a leg 82. The two legs 82 are provided at the end thereof with a curved retainer 83 of an S-shaped construction and facing each other, and in the outer side of the body thereof with a side hook 84 extending downwards and outwards. As shown in FIG. 2, the retaining device 80 at work is disposed across a cooling piece 85 such that the curved retainers 83 of the two legs 82 catch the CPU heat conductive piece 87 located at the bottom of the cooling piece 85.

Such a prior art retaining device 80 as described above has shortcomings, which are described hereinafter.

In the processing of installing the prior art retaining device 80, both ends of the retaining device 80 must be pressed. As a result, the retaining device 80 can not be easily installed on the cooling piece 85 and the CPU heat conductive piece 87. Both ends of the retaining device 80 are located under a fan 88 of the cooling piece, as shown by the imaginary lines. The fan 88 obstructs the hand with which both ends of the retaining device 80 are pressed. The fan 88 also obstruct the view of a person working to install the retaining device 80. In addition, the fingers of the person are obstructed by the cooling plates 86 located at the top of the cooling piece 85 at the time when both ends of the retaining device 80 are pressed with the fingers.

The retaining device 80 can not be easily detached without the help of a slotted screwdriver 89 as shown by the imaginary lines. The screwdriver 89 is used to press against the side hook 84 for actuating the leg 82 to displace upwards and outwards, thereby causing the curved retainer 84 to slip out so as to enable the retaining device 80 to be moved away from the bottom of the CPU conductive piece 87. In addition, the screwdriver 89 is used under the circumstance that there is a lack of point of application, and that the cooling piece 85 is used as a fulcrum on which the leg 82 is taken out. In short, the computer is provided with a limited space in which the screwdriver 89 can not be easily maneuvered.

SUMMARY OF THE INVENTION

It is therefore the primary objective of the present invention to provide a device for retaining a CPU cooling device. The retaining device can be easily mounted and dismounted.

In keeping with the principle of the present invention, the foregoing objective of the present invention is attained by a retaining device comprising a main body which is provided with two legs opposite to each other. Each leg is provided with a hook extending outwards and upwards, and a retainer. The main body is provided at both ends thereof with a winged portion extending outwards and having a through hole.

The objective, features, functions, and advantages of the present invention will be more readily understood upon a thoughtful deliberation of the following detailed description of a preferred embodiment of the present invention with reference to the accompanying drawings.

BRIEF DESCRIPTION OF THE DRAWINGS

FIG. 5 is an operational schematic view showing the operations of the winged portion and the hook of the preferred embodiment of the present invention.

FIG. 6 is an operational schematic view showing the roles of the through le and the legs of the preferred embodiment of the present invention.

DETAILED DESCRIPTION OF THE INVENTION

Figure 1:
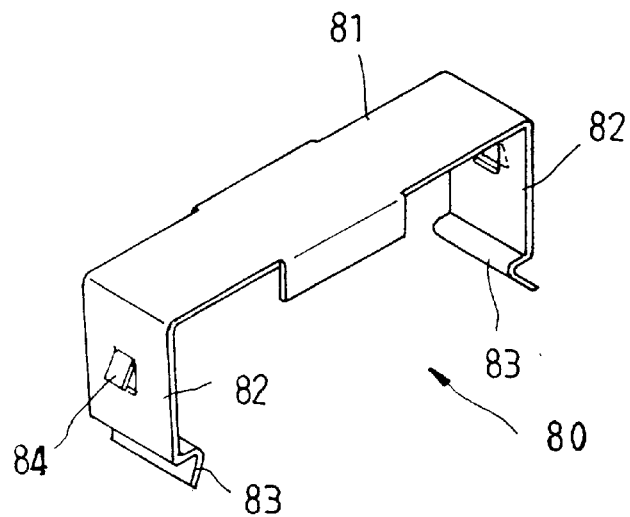
FIG. 1 shows a perspective view of a CPU retaining device of the prior art.
Figure 2:
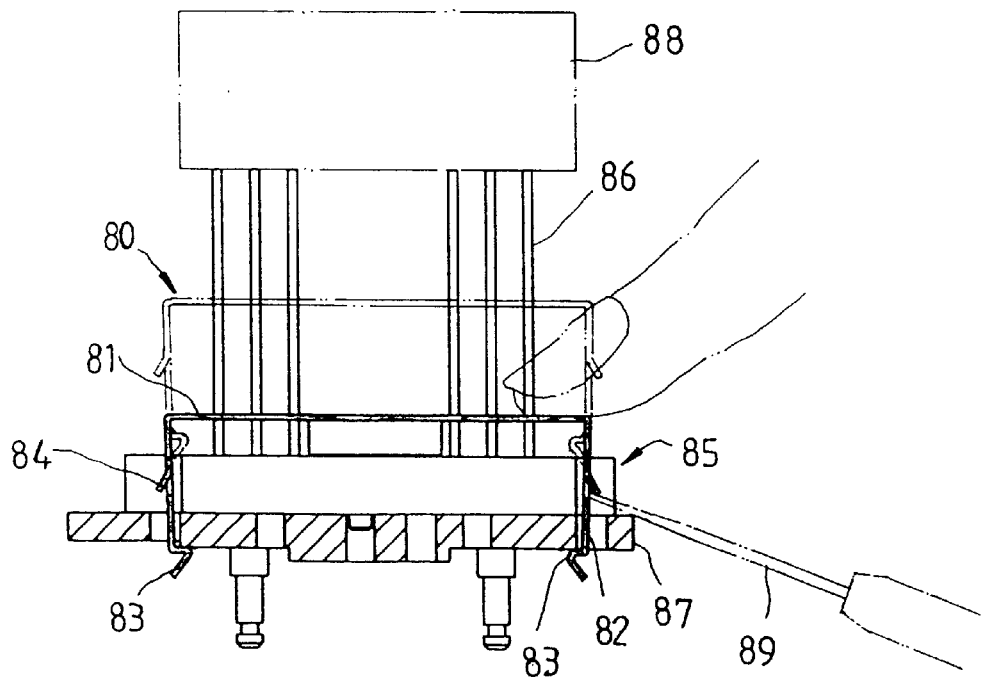
FIG. 2 shows a schematic view of the CPU retaining device of the prior art in use.
Figure 3:
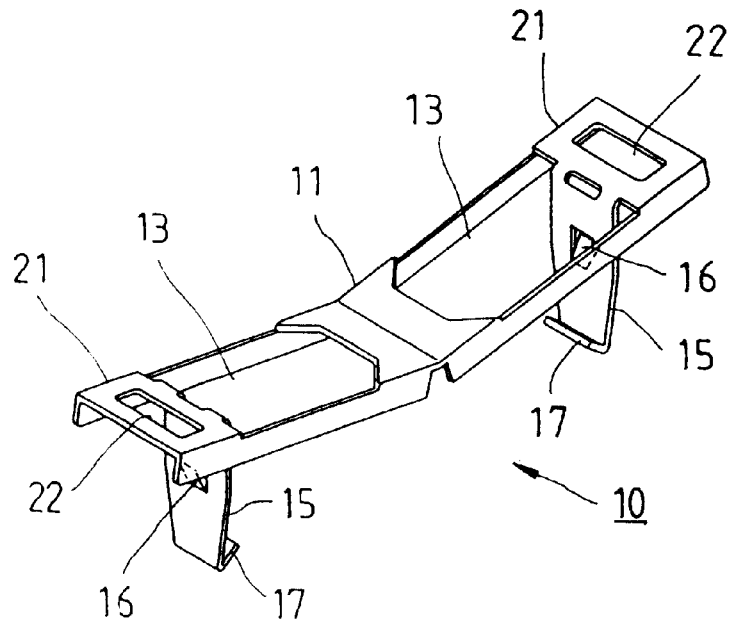
FIG. 3 shows a perspective view of the preferred embodiment of the present invention.

As shown in FIG. 3, a device 10 embodied in the present invention is designed to retain the computer CPU cooling piece. The device 10 comprises a main body 11 having two raised segments opposite to each other such that the main body II has a V-shaped longitudinal section. The two raised segments of the main body 11 are provided with a through hole 13 and a leg 15 which is located at the outer side of the through hole 13 and is provided with a hook 16 extending outwards and upwards. The leg 15 is provided at one end thereof with a curved retainer 17 extending upwards. The curved retainers 17 of the two legs 15 face each other. The main body 11 is provided at both ends thereof with a winged portion 21, which is in turn provided with a through hole 22.

Figure 4:
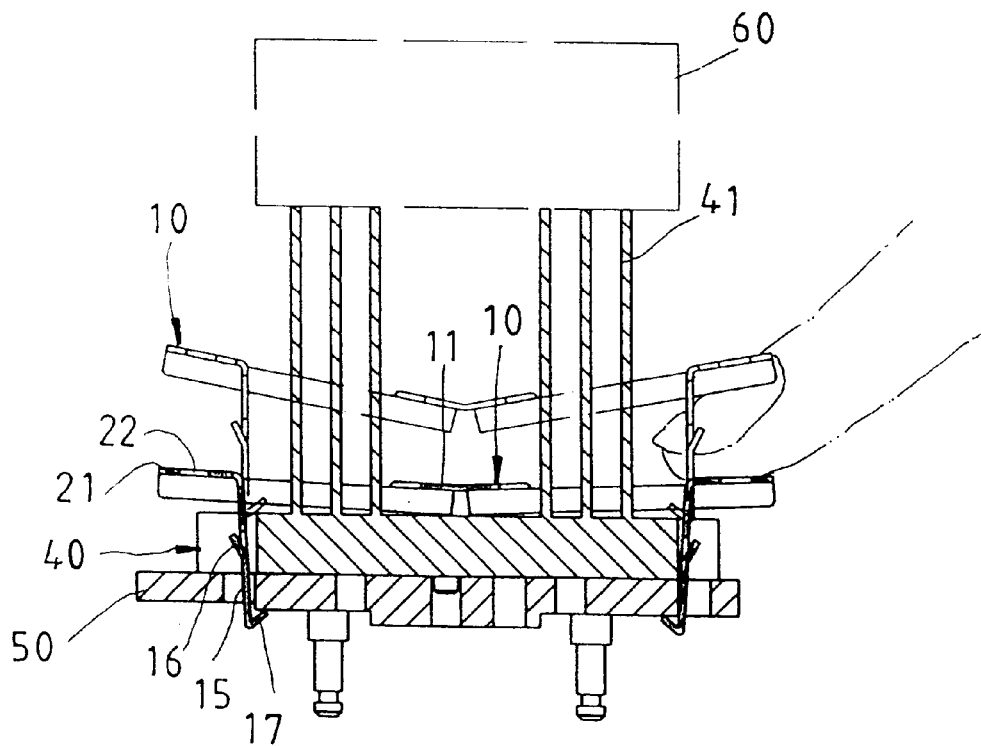
FIG. 4 shows a schematic view of the mounting of the preferred embodiment of the present invention.

As shown in FIG. 4, the cooling piece is mounted on the CPU heat conductive piece such that the two winged portions 21 of the retaining device 10 are held with hand, and that two sides of the CPU cooling piece 40 are pressed against by the two legs 15, as illustrated by the imaginary lines, and further that the two winged portions 21 are pressed downwards so as to cause the midsegment of the main body 11 to come in contact with the top of the cooling piece 40. As the two winged portions 21 are further pressed downwards, the raised segments of the main body 11 bounce back up such that the retainer 17 moves through the cooling piece 40 and the side wall of the CPU heat conductive piece 50 so as to catch the bottom wall of the CPU heat conductive piece 50. In the meantime, the bouncing action of the two raised segments of the main body 11 causes the retainer 23 to catch securely the bottom wall of the CPU heat conductive piece 50. As a result, the cooling piece 40 is securely held in place on the heat conductive piece 50. In light of the two winged portions 21 being jutted out of the legs 15, as well as the cooling piece 40, the winged portions 21 are not obstructed by the fan 60 located over the cooling piece 40 and the cooling plate 41 located on the cooling piece at such time when the two winged portions 21 are forced downwards. Moreover, the two winged portions 21 are visible to an operator.

Now referring to FIG. 5, a screwdriver 70, which is shown by the imaginary lines, is shown to be inserted into the through hole 23 of one winged portion 21 such that the tip of the screwdriver 70 is engaged with the hook 16. The screwdriver 70 is then moved outwards on a fulcrum which is the contact portion between the screwdriver 70 and the winged portion 21. As a result, the hook 16 and the leg 15 are actuated to move outwards such that the retainer 17 moves away from the heat conductive piece 50, and that the raised segments of the main body 11 move back up to their original positions to cause the retainer 17 to move away from the retaining position. As a result, the retaining device 10 is detached.

As shown in FIG. 6, the screwdriver 70 is inserted into the through hole (not shown in the drawing) of the main body 11 such that the screwdriver 70 is located between the leg 15 and the cooling piece 40, as shown by the imaginary lines. As the tip of the screwdriver 70 is moved outwards, the retainer 17 of the leg 15 is caused to move away from the bottom wall of the heat conductive piece 50, thereby resulting in the detachment of the retaining device 10 of the present invention.

The two legs 15 of the present invention may be fastened with the main body 11 of the present invention by welding in place of punching and pressing. Under such a circumstance, a screwdriver is used to detach the retaining device such that the screwdriver is engaged with the hook 16 via the through hole 22 of the winged portion 21, so as to take the leg 15 out.

The present invention has advantages, which are described hereinafter.

The present invention can be easily installed in view of the fact that the two winged portions 21 are jutted out of the cooling piece 40 to avoid being obstructed by the fan 60 located over the cooling piece 40, and that the winged portions 21 are clearly visible to an operator installing the device of the present invention, and further that the winged portions 21 are not obstructed in any way by the cooling plate 41 located on the cooling piece 40.

The present invention can be easily dismounted by using a screwdriver 70 which is inserted into the through hole 22 of the winged portions 21 to engage the hook 16. The dismounting of the present invention is done with the screwdriver 70 by making use of the winged portion 21 as a fulcrum. The cooling piece 40 is not used as a fulcrum to engage in the work of dismounting the device of the present, thereby providing the cooling piece 40 with protection against damage.

What is claimed is:

1. A retaining device of a computer CPU cooling piece, said retaining device comprising a main body which is provided in two segments thereof with two legs opposite to each other, with each of said two legs having a hook extending outwards and upwards whereby said two legs are provided at one end thereof with a retainer, said main body further provided at both ends thereof with a winged portion extending outwards and having a through hole.

2. The retaining device as defined in claim 1, wherein said retainer is of a curved construction.

3. The retaining device as defined in claim 1, wherein said segments of said main body are raised whereby said main body has a V-shaped longitudinal section.

4. The retaining device as defined in claim 1, wherein said segments are provided with two through holes, with each being located in an inner side of said leg.

* * * * *